United States Patent [19]

Drenkelfort

[11] Patent Number: 4,504,931
[45] Date of Patent: Mar. 12, 1985

[54] ECHO-SOUNDING APPARATUS

[75] Inventor: Hans Drenkelfort, Kiel, Fed. Rep. of Germany

[73] Assignee: Honeywell-Elac-Nautik GmbH, Kiel, Fed. Rep. of Germany

[21] Appl. No.: 410,122

[22] Filed: Aug. 20, 1982

[30] Foreign Application Priority Data

Aug. 21, 1981 [DE] Fed. Rep. of Germany ....... 3133080

[51] Int. Cl.³ ............................. G01S 7/60; G01S 7/66
[52] U.S. Cl. .................................................... 367/115
[58] Field of Search ......................................... 367/115

[56] References Cited

U.S. PATENT DOCUMENTS

| | | | |
|---|---|---|---|
| 3,332,056 | 7/1967 | Drenkelfort | 367/115 |
| 3,350,682 | 10/1967 | Drenkelfort et al. | 367/115 |
| 3,440,598 | 4/1969 | Drenkelfort et al. | 367/115 |
| 4,308,601 | 12/1981 | Lahr | 367/115 |

Primary Examiner—Richard A. Farley
Attorney, Agent, or Firm—Charles L. Rubow

[57] ABSTRACT

Echo-sounding apparatus with circuitry for achieving enhanced recording on electrically sensitive paper is disclosed in which the gain of a variable gain amplifier is reduced exponentially depending on the input signal amplitude as soon as this amplitude exceeds a predetermined level. The signal generated by the variable gain amplifier is supplied to low pass and high pass filters which are connected to two inputs of a differential amplifier which controls the recording element.

12 Claims, 1 Drawing Figure

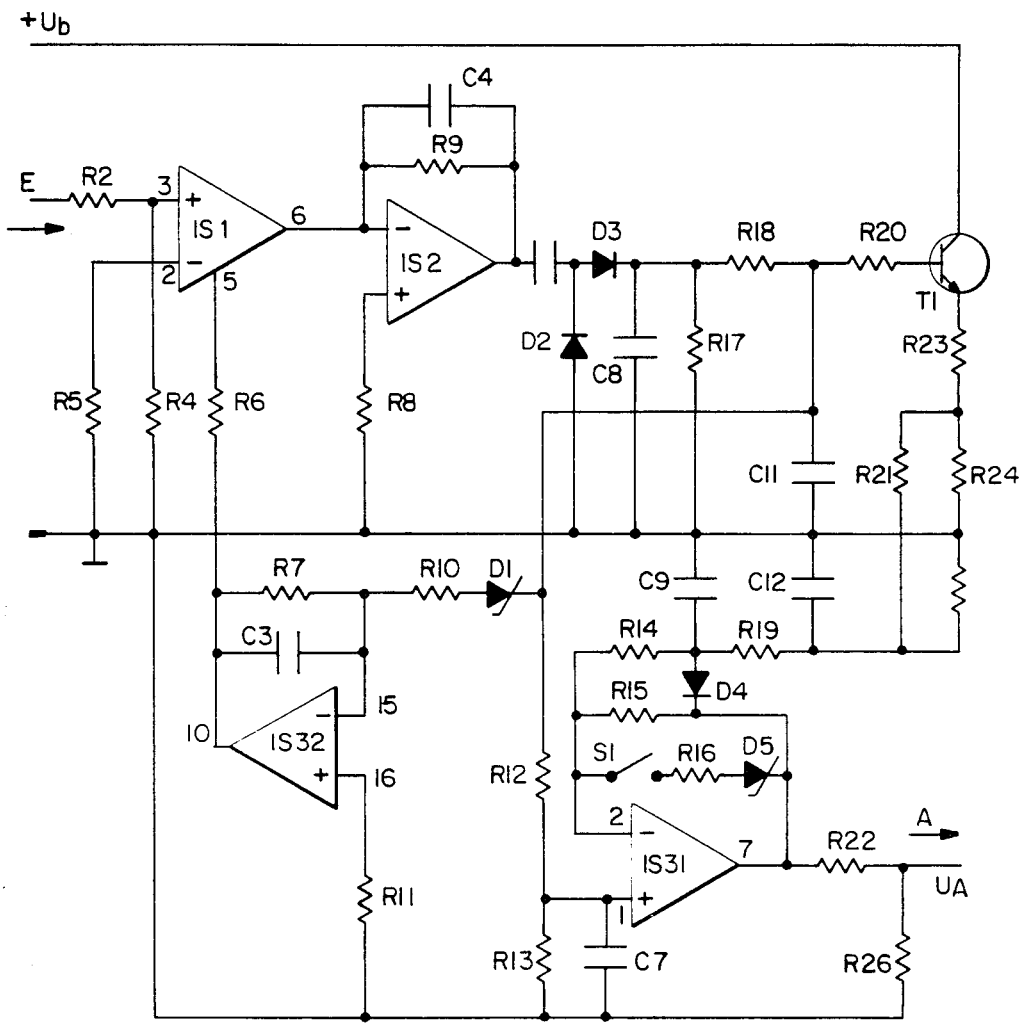

ECHO-SOUNDING APPARATUS

BACKGROUND OF THE INVENTION

The invention relates generally to an echo sounding apparatus and more particularly to circuitry for enhancing the representation of echo signals recorded on electrically sensitive paper.

One recording medium which has been found quite suitable and is commonly used for recording representations of echo sounding signals is electrically sensitive paper. The present invention is described in a system for achieving enhanced recording of echo sounding signals on such paper. However, it is also useful for achieving enhanced representations of signals having a wide dynamic range on various other media.

Electrically sensitive paper typically comprises a conductive layer of carbon covered by an opaque layer of paper which, during the recording operation, is burned away to varying degrees to variably expose the black carbon layer underneath. It is known that the dynamic range of echo sounding signals is substantially larger than the range of variation which can be distinguishably recorded on electrically sensitive paper. More particularly, echo sounding signals commonly cover a range of about 40 dB which corresponds to a ratio of 1:100. By way of comparison, the range of variation which can be readily distinguished on electrically sensitive paper is only about 20 dB, or a ratio of 1:10.

Dynamic compression of the signals for reconciling these ranges of change is not suitable since, it would also result in a substantial reduction in contrast of the record. One solution to this problem, is shown in U.S. Pat. No. 3,350,682 issued to the present application on Oct. 31, 1967. This patent discloses echo sounding apparatus in which amplifier gain is controlled both by negative feedback comprising the output signal from which AC-components have been filtered and unfiltered positive feedback. Such an arrangement effectively provides higher amplification of rapidly changing echo signals than DC signals or slowly changing signals. The negative feedback prevents the recorder from operating in a saturated mode. This combined use of positive and negative feedback results in an increase in the contrast of the record. Accordingly, it permits enhanced recording of objects closely above or below the sea bottom, whose signals would be almost indistinguishable in the stronger return signals from the interface between the sea water and sea bottom. In addition, the disclosed technique is useful in reducing the effects of high attenuation of the echo signal within the sea water medium so as to permit the detection of weak echos from objects of interest below and above the sea bottom.

The applicant's U.S. Pat. No. 3,332,056 issued on July 18, 1967 discloses a circuit for achieving a frequency-dependent increase in the contrast of recorded echo signals. In this circuit echo signals are separated into higher frequency and lower frequency portions on the basis that echoes from fishes and small structures, because of their smaller dimensions, include more pulse-like and therefore higher frequency portions than echos such as those produced by the sea bottom. If the higher frequency portions of the signals are filtered out by means of a frequency-dependent network and are amplified more than the lower frequency portions, the representation of fishes and small structures is improved. The circuit comprises two low pass filters with substantially different time constants, the output signals of which are combined so that the low frequency portions are at least partially suppressed and the high frequency portions appear more prominent.

It is the object of the present invention to improve the readability of a record of echo signals such that even weakly reflecting objects and structures can easily be noticed and are not covered by the echoes from strongly reflecting objects, in particular by the echo from the sea bottom.

SUMMARY OF THE INVENTION

The applicant's echo sounding apparatus basically comprises circuitry for providing constant amplification of input signals below a predetermined amplitude, and gain which follows a logarithmic function for input signals above the predetermined amplitude. The predetermined amplitude preferably is chosen such that fish echos are amplified linearly, whereas stronger echos, in particular the echos from the sea bottom, are attenuated before recording. Since echos from structures below the sea bottom in no case are stronger than fish echoes, they also will be recorded with full amplitude. Simultaneously, by attenuating the bottom echo, it is prevented from obscuring echos from fishes, small structures and objects below the sea bottom.

A differential amplifier in the apparatus delivers an output signal corresponding to the difference of the two input signals supplied to its two inputs via two RC-filter networks. The high frequency portions of the received signals, i.e., those originating from small structures, are attenuated less than the low frequency portions. Accordingly the readability of weak signals is improved. However, for strong signals, in particular the bottom echo, the differential amplifier produces a signal indicative of the difference of two logarithmic signals which represents the quotient of the two input signals. This process overcomes a further difficulty arising from the fact that movement of a ship up and down in the waves, causes the bottom echo to be subject to strong fluctuations. These fluctuations affect the low frequency and high frequency components in the same manner.

Since the quotient of the two signal portions is independent of the absolute echo strength, the recorded signal is free of fluctuations. The invention, therefore, not only leads to an improved recording of weak echoes, i.e. those from small structures below the sea bottom, but in addition provides an improved record of the bottom echo and thereby improves the readability of the echo record.

BRIEF DESCRIPTION OF THE DRAWING

The single FIGURE of the drawing is a schematic circuit diagram of an echo sounding system receiver circuit in accordance with the applicant's invention.

DESCRIPTION OF THE PREFERRRED EMBODIMENT

An echo signal provided by a receiving transducer (not shown) appears at an input terminal E and is supplied to controllable amplifier means comprising two AC-amplifiers IS1 and IS2 connected in series. The output signal of amplifier IS2 is rectified by means of a rectifier circuit comprising diodies D2 and D3 and a capacitor C8, and is delayed by means of a first low pass comprising a resistor R18 and a capacitor C11 and a second low pass filter the output signal of which is to a differential D-C amplifier IS31. From the output A of this amplifier the signal is fed to the recording element of a recorder. An impedance converter comprising a transistor T1 is connected to the output of the first low pass filter R18/C11. A third low pass filter R21/C12 and a fourth low pass filter R19/C9 are connected to the output of the impedance converter through resistors 23 and 24 which may comprise part of a potentiometer. The time constant of the second low pass filter R12/C7 substantially smaller than the time constant of the third and the fourth low pass filters. The output signal of amplifier IS31 corresponds to the difference of the two signals fed to its inputs 1 and 2. This output signal represents echo signals having enhanced contrast as known from U.S. Pat. No. 3,332,056. The relative values of resistors R23, R24 and the gain of the differential amplifier IS31 determine the amount of contrast increase. If resistors R23 and R24 are part of a potentiometer, the increase in contrast can be adjusted.

Connected to the output of rectifier D2/D3 and the output of the first low pass filter R18/C11 is a level switch shown as a zener diode D1 which is connected to the negative input 15 of an operational amplifier IS32 via a resistor R10 further connected to the output of said operational amplifier via a further resistor R7. The positive input 16 of operational amplifier IS32 is connected by means of a resistor R11 to a source of reference potential. The output current of operational amplifier IS32 controls, via a resistor 6 and an input terminal 5, the gain of the first AC-amplifier IS1. A closed gain control loop is formed via the second AC-amplifier IS2, the rectifier circuit D2, D3, C8 and the first low pass filter R18/C11. The control loop controls the gain of AC-amplifier IS1 in proportion to the output signal of the first low pass filter. This results in an exponential attenuation of the input signals exceeding the level value determined by zener diode D1. The steepness of the exponential attenuation is determined by the relative values of resistors R10/R7 in conjunction with resistor R6. The level value is chosen such that the strongest expected fish echoes are fully amplified. The intensity of such echos is normally about 20% to 25% of the intensity of the bottom echo. Accordingly, dynamic compression of echo signals above a predetermined level value, is achieved and a substantially improved record is obtained. In particular, only slightly reflecting objects within the water, e.g., plankton and plants and objects below the sea bottom are well recorded.

As mentioned above, the DC-amplifier IS31 is a differential amplifier which receives at one input a signal derived from the high frequency components of the received echo signal and receives at its other input a time delayed signal derived from the low frequency components of the received echo signal. As long as amplifier means IS1, IS2 operates in the linear range of gain, DC-amplifier IS31 delivers an output signal $U_A$ corresponding to the difference of the two signal components at its inputs. If, however, the amplifier means operates in its logarithmic range of gain because of receiving strong echo signals, the DC-amplifier IS31 derives the difference of two logarithmic signals and produces an output signal which is proportional to the quotient of the echo signal components. This output signal is independent of the absolute echo intensity.

In order to prevent shadows of the bottom echo from covering part of the record of weaker echoes, the illustrated circuitry includes a switchable amplitude-dependent negative feedback path for the DC-amplifier IS31. Via switch S1 the series circuit of a resistor R16 and a zener diode D5 can be switched in parallel with a feedback resistor R15. This provides for enhanced detection of structures lying below sea bottom such as mud, grit, sand, marl, etc. With such an arrangement acoustically soft material and acoustically hard material can be readily distinguished by different gray tones of the records. For particular applications switch S1 may be omitted, and the series circuit R16, D5 provided permanently in the negative feedback path of DC-amplifier IS31.

A diode D4 between the output of the fourth low pass filter R19/C9 and the output of DC-amplifier IS31 prevents undesired brightening of the record in areas below representations of strongly reflecting layers. Additional capacitors may be switched in parallel with capacitors C9 and C11. This preferably is done based on the water depth, e.g., by means of a pulse length switch an the echo-sounding apparatus. Increasing the value of capacitor C11 increases the low pass properties, whereby suppression of short duration interference is increased. By increasing the value of capacitor C9, the recorded lines become broader, which, in accordance with the larger measuring ranges used in deep sea exploration, improves readability of the record of reflecting layers in sea bottom sediment.

I claim:

1. In echo sounding apparatus of the type having an electroacoustic receiving transducer which supplies input signals through controllable amplifier means to a recorder for recording the echo signals on current sensitive paper, the improvement which comprises:

means for varying the gain of said controllable amplifier means as a function of the amplitude of the input signal such that the gain is reduced according to an exponential function as the signal exceeds a limit value by an increasing amount;

first and second frequency dependent networks connected in parallel to the output of said controllable amplifier means, said networks being designed such that one network attenuates lower frequencies of the input signal more than the other network attenuates higher frequencies of the input signal;

a differential amplifier provided in the signal having first and second inputs, and an output connected to supply signals to said recorder; and means connecting the outputs of said first and second networks to the first and second inputs respectively of said differential amplifier.

2. Apparatus according to claim 1 wherein said means for varying the gain of said controllable amplifier means comprises a rectifier, a level sensitive device and a first operational amplifier, said first operational amplifier having inverting and noninverting inputs and an output, said rectifier, said level sensitive device and said first operational amplifier being arranged such that said level sensitive device is connected between the output of said rectifier and the noninverting input of said first operational amplifier whose output signal is supplied to the gain control input of said controllable amplifier means.

3. Apparatus according to claim 2 wherein said level sensitive device is a first zener diode connected between the output of said rectifier and an end terminal of a voltage divider having another end terminal connected to the output of said first operational amplifier and an intermediate tap connected to the inverting input of said first operational amplifier, the non-inverting input of which is connected to a reference potential source.

4. Apparatus according to claim 2 or 3 further including a first low pass filter connected between said rectifier and said level sensitive device.

5. Apparatus according to claim 4 further including negative feedback means between said rectifier and said recorder, comprising:
a second operational amplifier having inverting and non-inverting inputs and an output;
a second low pass filter connected between said first low pass filter and the non-inverting input of said second operational amplifier;
an impedance converter;
a third low pass filter;
a fourth low pass filter; and
means connecting said third and fourth low pass filters between said impedance converter and the inverting input of said second operational amplifier, said second, third and fourth low pass filters being configured such that the time constant of said second low pass filter is substantially lower than the time constant of said combined third and fourth low pass filters.

6. Apparatus according to claim 5 wherein said impedance converter comprises a transistor whose emitter electrode is connected to the reference potential source through a voltage divider whose center tap is connected to said third low pass filter.

7. Apparatus according to claim 6 further including a diode connected to carry current from the output of said fourth low pass filter to the output of said second operational amplifier.

8. Apparatus according to claim 5 wherein said first low pass filter includes a first capacitor, and a second capacitor is connected in parallel with said first capacitor.

9. Apparatus according to claim 8 wherein said fourth low pass filter includes a third capacitor, and a fourth capacitor is connected in parallel with said third capacitor.

10. Apparatus according to claim 9 further including switch means arranged to selectively connect said second and fourth capacitors in parallel with said first and third capacitors respectively in coordination with the length of the transmission pulse.

11. Apparatus according to claim 10 further including a resistor and a second zener diode connected in series, the resistor and second zener diode being connected in parallel with a negative feedback resistor of said second operational amplifier.

12. Apparatus according to claim 11 wherein said series combination of a resistor and diode can be selectively connected between the output and inverting input of said second operational amplifier by means of a mode of operation switch.

* * * * *

UNITED STATES PATENT AND TRADEMARK OFFICE
CERTIFICATE OF CORRECTION

PATENT NO. : 4,504,931
DATED : MARCH 12, 1985
INVENTOR(S) : HANS DRENKELFORT

It is certified that error appears in the above-identified patent and that said Letters Patent is hereby corrected as shown below:

Claim 1, line 17, delete "provided in the signal".

Signed and Sealed this

Second Day of September 1986

[SEAL]

Attest:

DONALD J. QUIGG

Attesting Officer

Commissioner of Patents and Trademarks